US007555835B2

(12) United States Patent
Choudhury et al.

(10) Patent No.: US 7,555,835 B2
(45) Date of Patent: Jul. 7, 2009

(54) FABRICATING A MONOLITHIC MICROWAVE INTEGRATED CIRCUIT

(75) Inventors: Debabani Choudhury, Thousand Oaks, CA (US); Adele E. Sohmitz, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 94 days.

(21) Appl. No.: 11/707,182

(22) Filed: Feb. 14, 2007

(65) Prior Publication Data

US 2007/0146093 A1 Jun. 28, 2007

Related U.S. Application Data

(62) Division of application No. 10/856,106, filed on May 28, 2004, now Pat. No. 7,348,864.

(51) Int. Cl.
*H05K 3/02* (2006.01)
*H05K 3/10* (2006.01)

(52) U.S. Cl. ............................ 29/846; 29/412; 29/600; 29/832; 333/248

(58) Field of Classification Search .................. 29/411, 29/412, 592.1, 600, 832, 846, 852; 134/1; 216/17; 333/24 R, 26, 33, 113, 248, 700 MS; 438/17, 111, 605

See application file for complete search history.

(56) References Cited

U.S. PATENT DOCUMENTS 3,846,905 A * 11/1974 Harper ....................... 438/111
4,800,350 A 1/1989 Bridges et al. .............. 333/239
5,071,792 A * 12/1991 VanVonno et al. ............ 438/17
5,502,002 A * 3/1996 Wong et al. ................. 438/605
5,511,238 A 4/1996 Bayraktaroglu .............. 455/81
5,853,489 A * 12/1998 Kitazawa ....................... 134/1
6,677,837 B2 * 1/2004 Kojima et al. ................. 333/26
6,750,736 B1 6/2004 Weller et al. .................. 333/26
6,781,476 B2 8/2004 Tsunoda et al. ............. 333/110

OTHER PUBLICATIONS

Dawson, D., et al., "Cryogenic Measurements of 183 Ghz MMIC Low Noise Amplifiers," *IEEE MTT-S Digest*, pp. 1585-1587 (2003).

(Continued)

*Primary Examiner*—Donghai D. Nguyen
(74) *Attorney, Agent, or Firm*—Ladas & Parry

(57) ABSTRACT

A method of fabricating a monolithic microwave integrated circuit (MMIC) with one or more coupling transmission structures protruding from the MMIC includes providing a support substrate, providing a wafer containing a face side, a back side, and a plurality of individual MMICs disposed on the face side, and providing a material for holding the wafer on the support substrate. The method further includes applying the material and placing the wafer on to the support substrate so as the face side is disposed on the support substrate and the material is disposed between the face side and the support substrate. In addition, the method includes performing a disjoin process wherein the plurality of individual MMICs are disjoined from the wafer with the one or more coupling transmission structures protruding from the plurality of individual MMICs, the one or more coupling transmission structures being supported by at least a portion of the face side of the wafer. The method further includes removing the material holding the wafer on the support substrate.

31 Claims, 19 Drawing Sheets

65
Thru-Street patterns
30
25
35
40
2
1

OTHER PUBLICATIONS

Morgan, M., et al., "A MMIC-Based 75-110 GHZ Signal Source," *IEEE MTT-S Digest*, pp. 1859-1862 (2002).

Räisänen, A.V., et al., "A Novel Split-Waveguide Mount Design For Millmeter-and Submillimeter-Wave Frequency Multipliers and Harmonic Mixers," *IEEE Microwave And Guided Wave Letters*, vol. 3, No. 10, pp. 369-371 (Oct. 1993).

Weinreb, S., et al., "High-Gain 150-215-Ghz MMIC Amplifier With Integral Waveguide Transitors," *IEEE Microwave And Guided Wave Letters*, vol. 9, No. 7, pp. 282-284 (Jul. 1999).

* cited by examiner

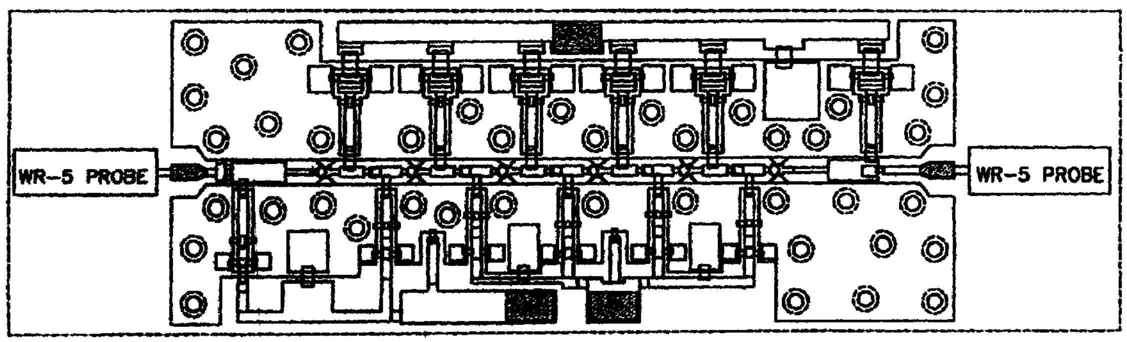
Figure 3 --PRIOR ART--

FABRICATING A MONOLITHIC MICROWAVE INTEGRATED CIRCUIT

CROSS REFERENCE TO RELATED APPLICATIONS

This application is a divisional of U.S. application Ser. No. 10/856,106, filed on May 28, 2004, and issued as U.S. Pat. No. 7,348,864.

STATEMENT OF GOVERNMENT INTEREST

This invention was made with government support under Contract No. F33615-99-C 1512 funded by the Air Force Research Laboratories and DARPA-MTO.

FIELD OF THE INVENTION

This invention relates to Integrated Circuits with coupling transmission structures that are being used as onboard probes or onboard antennas, which eliminate ribbon/wire bonding as well as the higher order modes in the waveguide.

BACKGROUND AND PRIOR ART

Monolithic Microwave Integrated Circuits (MMIC) are implemented with conventional microstrip or grounded coplanar waveguide (GCPW) circuit elements on thin semiconductor substrates. The thickness of the substrate depends on the frequency of operation. Although at mm-wave frequencies wafer measurements of MMICs have shown satisfactory performance, MMICs actually suffer significantly in performance once removed from the wafer and packaged using either a ribbon bond approach or a flip-chip approach. The ribbon bond and flip-chip packaging approaches have a severe and detrimental effect on the performance of the MMICs at mm-wave frequencies.

At higher-mm-wave and sub-mm-wave frequencies, most of the measurement equipment and MMIC modules have waveguide Inputs/Outputs (I/Os). Researchers have demonstrated MMIC modules by coupling MMIC I/Os to waveguide using, either waveguide transitions or antennas. These transitions can be placed on a semiconductor substrate and ribbon bonded to the MMIC, as shown in FIGS. 1 and 2. However, transitions that have been placed on the MMIC semiconductor substrate degrade the MMIC module performance by introducing higher order parasitic modes because MMICs are developed on semiconductor materials like InP, SiGe, GaAs.

The transitions that have been designed on high performance substrates are ribbon bonded to the MMIC. Unfortunately, the assembly approach is complicated, MMIC module designs with ribbon-bonding suffer from impedance mismatch and produce lower power than expected, and at sub-millimeter frequencies, planar coupling transmission structures need to have narrow width for desired circuit impedances.

Transitions have also been integrated into the MMIC module. See Weinreb, S., Faier, T., Lai, R., Barsky, M., Leong, Y. C., and Samoska, L., "High-Gain 150-215-Ghz MMIC Amplifier with Integral Waveguide Transitions", IEEE Microwave and Guided Wave Letters, Vol. 9, No. 7, pp 282-284, July 1999 (Weinreb). However; this approach still presents problems by introducing higher order modes. See FIG. 3.

The presently disclosed technology addresses the issues of higher order modes, parasitic modes, impedance mismatches by utilizing an integrated waveguide MMIC module quite unlike Weinreb. The presently disclosed technology eliminates or reduces the higher order modes in the waveguide by etching away extra high resistivity substrate around and/or underneath the coupling transmission structures. This allows the development of high-performance MMIC modules and subsystems at sub-millimeter and higher-millimeter wave frequencies.

BRIEF DESCRIPTION OF THE FIGURES AND THE DRAWINGS

FIG. 3 depicts a schematic of transition probes on the MMIC semiconductor substrate, "Prior Art";

Figure 7:
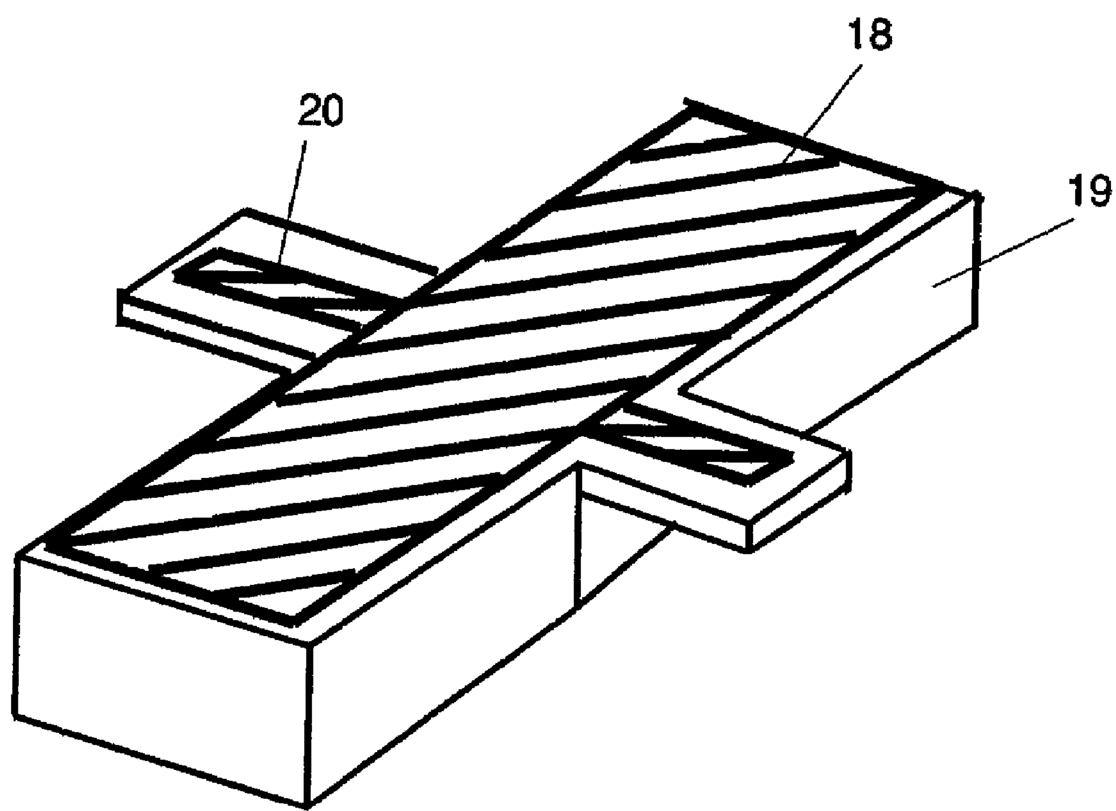
Figure 9:
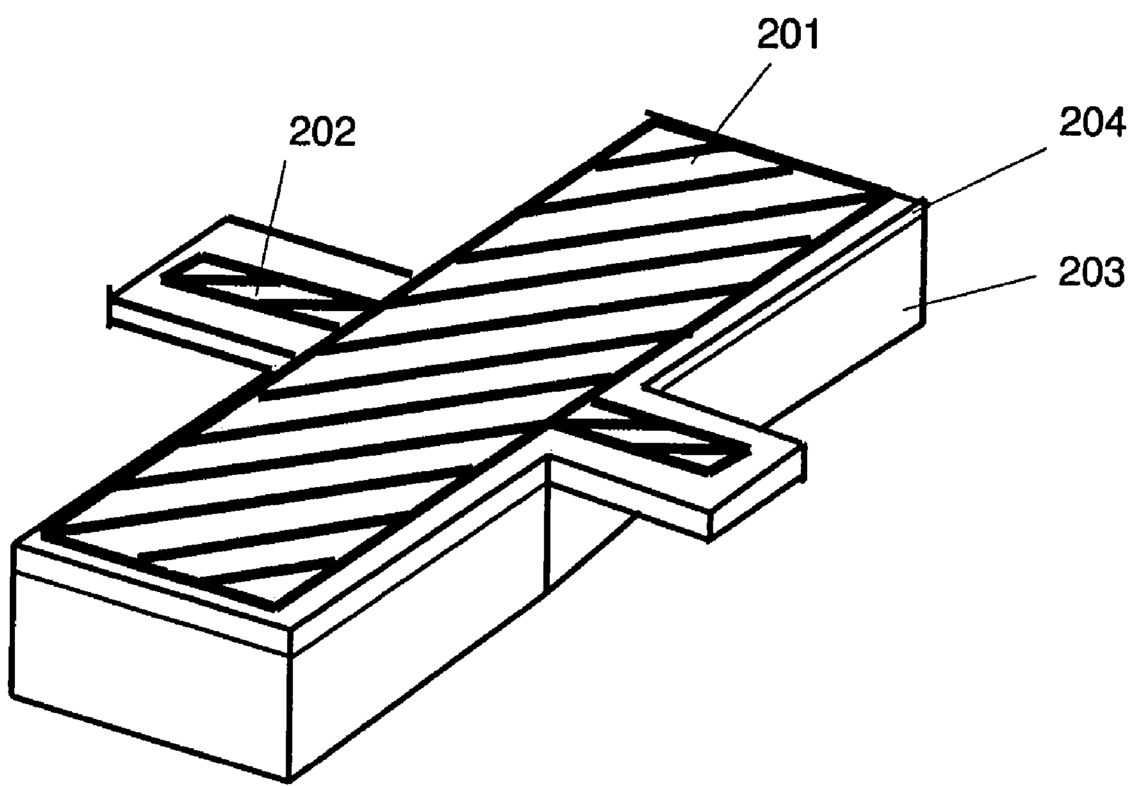

FIGS. 6*a-j* depict the process of removing the substrate material from around the coupling transmission structures that are extending from the integrated circuit;

FIG. 7 depicts the integrated circuit with the substrate material removed from around and under the transition probes;

FIGS. 8*a-l* depict the process of removing the substrate material from around and under the coupling transmission structures that are extending from the integrated circuit;

FIG. 9 depicts the integrated circuit including an etch stop layer wherein the substrate material removed from around and under the transition probes;

FIGS. 10*a-l* depict the process of removing the substrate material from around and under the coupling transmission structures that are extending from the integrated circuit by using an etch stop layer.

DETAILED DESCRIPTION

The present disclosure addresses the issues of higher order modes, parasitic modes, and impedance mismatches in the waveguide by disclosing an integrated waveguide MMIC. Based on the presently disclosed technology, monolithic modular components can be developed to eliminate the need for wirebonding planar coupling transmission structure-to-waveguide transition probes. The transition probe or antenna, depending on the desired function, is an integral part of the MMIC chip. The higher order modes in the waveguide can be eliminated or reduced by etching away extra high resistivity substrate around the coupling transmission structure (coupling probe or antenna). The reduction of higher order modes allows MMICs to operate at sub-millimeter and higher-millimeter wave frequencies. Indeed, an embodiment discloses integrated MMIC modules for higher millimeter and submillimeter wave system applications.

Pursuant to one embodiment, an integrated circuit module is disclosed, wherein the integrated circuit module includes integrated coupling transmission structures protruding from the main body of the integrated circuit with extra substrate material removed around and/or under the coupling transmission structures.

Figure 1:
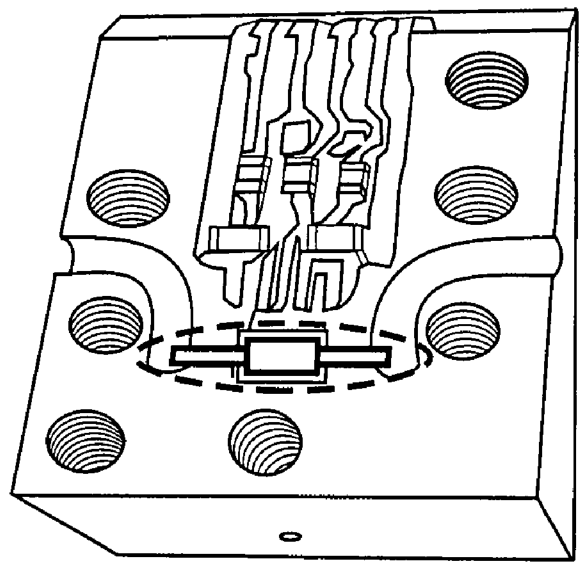
FIGS. 1 and 2 depict transition probes, on a semiconductor substrate, ribbon bonded to the MMIC for waveguide coupling, "Prior Art"
Figure 2:
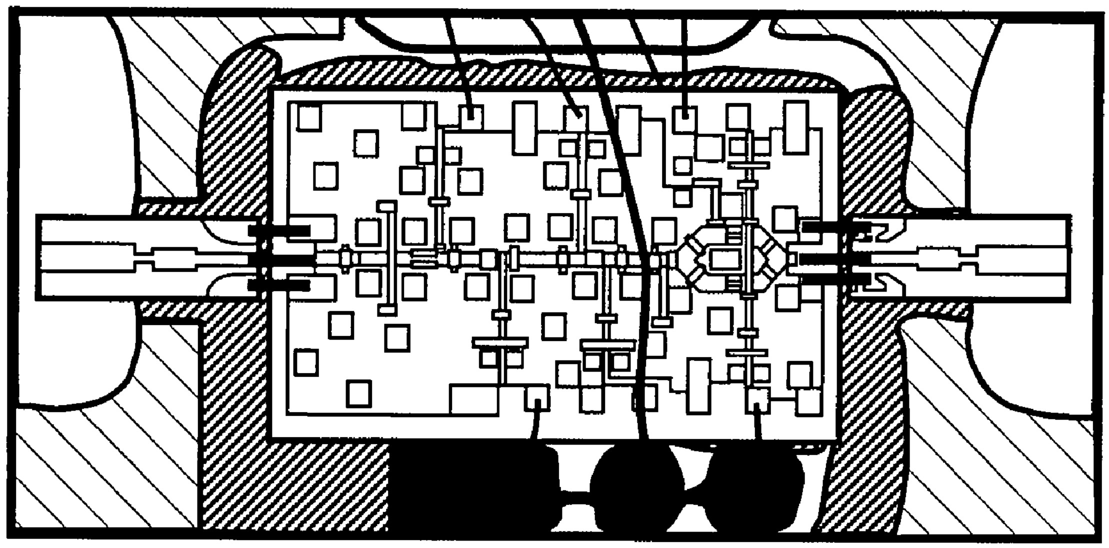
Figure 4A:
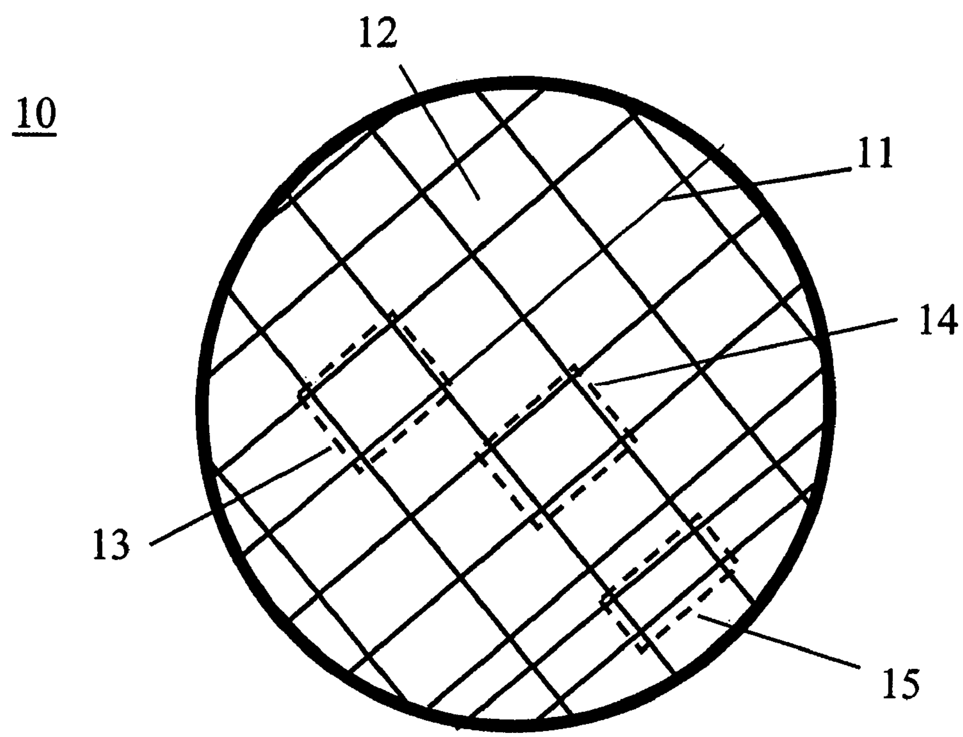
FIG. 4A depicts a thinned wafer with streets to define MMIC chip areas.

FIG. 4A shows a wafer 10 with streets 11 defining MMIC chip areas 12 before the chips are released from the wafer. MMIC chips 13, 14 and 15 are shown in FIGS. 4B, 4C and 4D, respectively, depict individual Integrated Circuits (ICs) located with in MMIC chip areas 12 of the wafer 10.

Figure 4B:
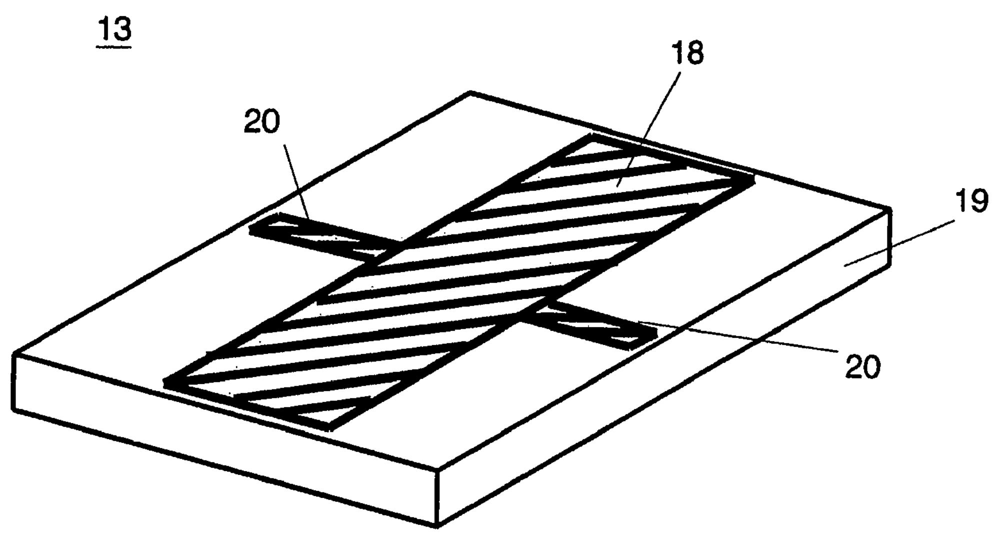
FIGS. 4B-4D depict individual Integrated circuits located within MMIC chip areas.
Figure 4C:
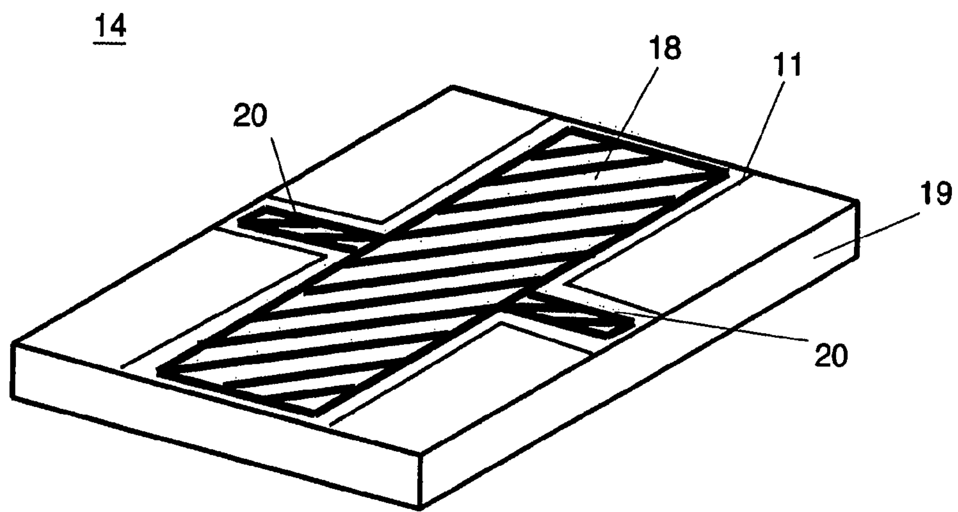
Figure 4D:
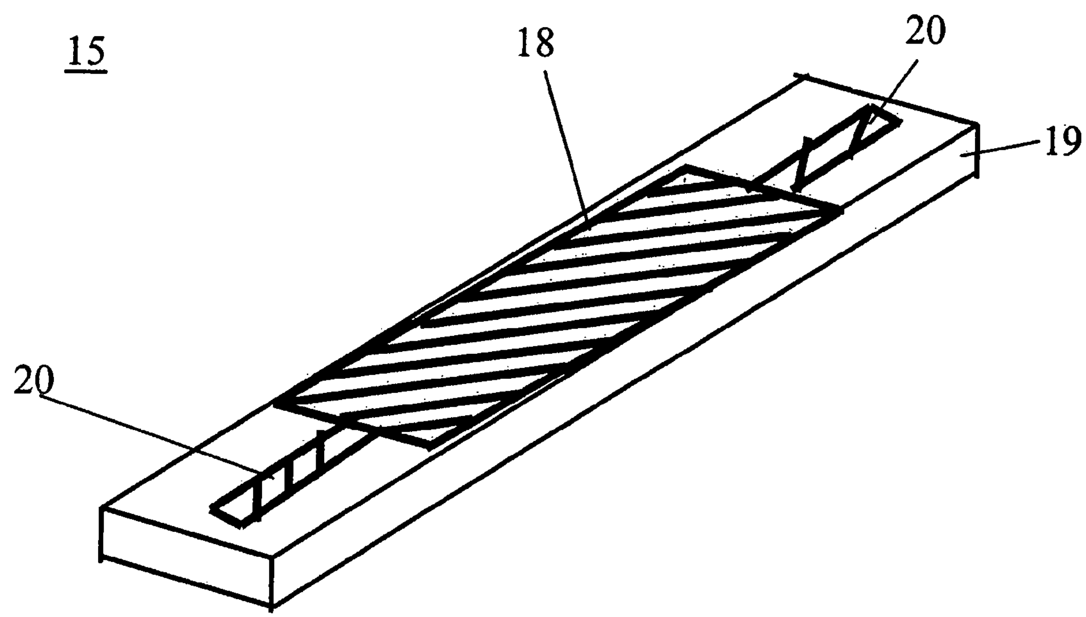

Integrated Circuits 18 are developed on the substrate material 19 of a wafer 10 with coupling transmission structures 20 extending from the Integrated Circuits 18, as shown by FIGS. 4B, 4C and 4D.

Figure 4E:
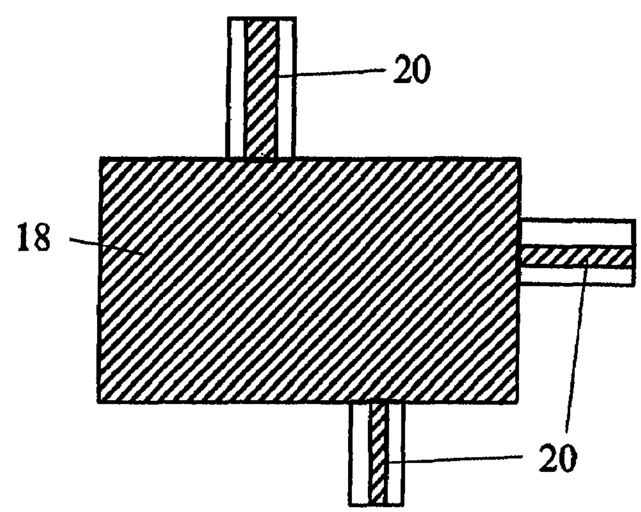
FIGS. 4E, 4F and 4G depict some of possible shapes and positions of the coupling transmission structures.
Figure 4F:
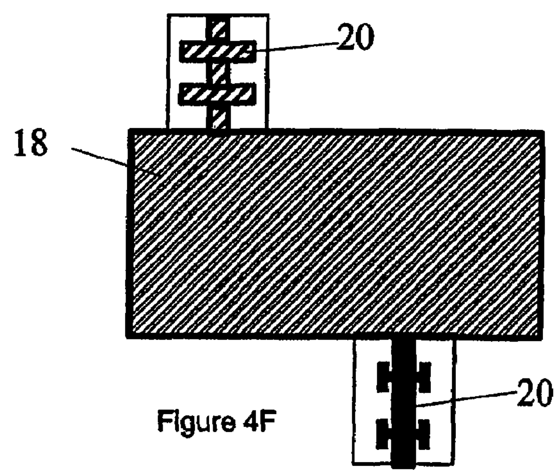
Figure 4G:
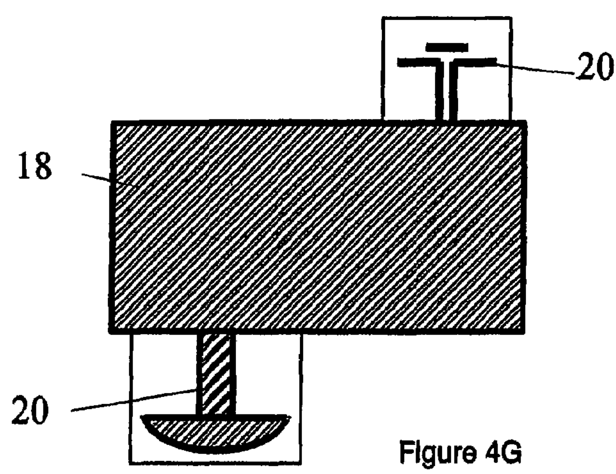

This disclosure is not limited to shape and positions of the coupling transmission structures 20 as depicted in FIGS. 4B to 4D. Coupling transmission structures 20 can vary in shape and can extend at different locations from the Integrated Circuit 18, for example, see FIGS. 4E, 4F and 4G.

Figure 5A:
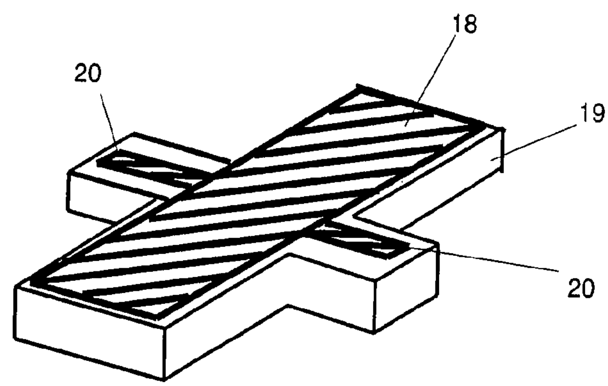
FIG. 5A depicts the integrated circuit with the substrate material removed around the coupling transmission structures.

In one embodiment, the presently disclosed technology improves the performance and reduces higher order modes of the Integrated Circuit module by removing excess semiconductor substrate material 19 around the coupling transmission structures 20, as shown by FIG. 5A. In this embodiment, the peripheral edge of the semiconductor substrate material 19 closely follows the peripheral edges of the Integrated Circuit 18 and coupling transmission structures 20. The distance between the peripheral edges of the semiconductor substrate material 19 and the peripheral edges of the Integrated Circuit 18and coupling transmission structures 20 in FIG. 5A is exaggerated for illustration purposes.

Figure 5B:
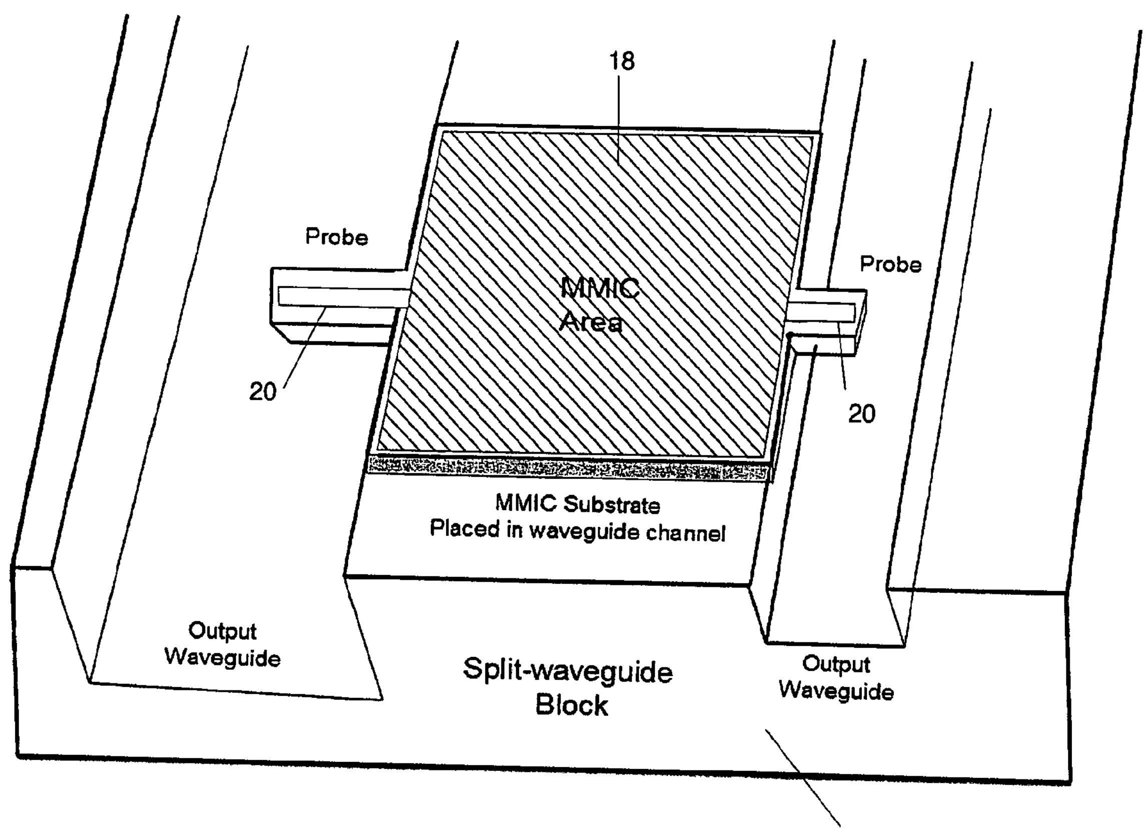
FIG. 5B depicts the integrated circuit with the substrate material removed around the coupling transmission structures placed in the waveguide.

FIG. 5B shows the placement of the Integrated Circuit 18 module as depicted in FIG. 5A inside the waveguide block 21. The removal of the extra substrate material decreases higher order modes.

The extra parasitic substrate material can be removed using a backside processing shown and described with reference to FIGS. 6*a-j*. FIGS. 6*a-j* represent the cross section of a wafer, containing multiple ICs, for each of the backside process steps.

Figure 6A:
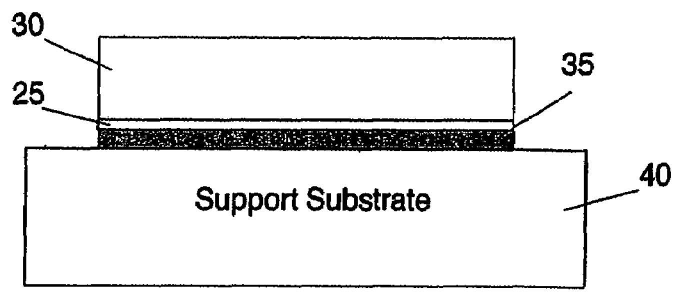

In FIG. 6*a*, a wafer comprises a substrate 30 and a circuitry layer 25. The wafer is mounted with the circuitry layer 25 down on to a support substrate 40 and held in place with a wax or other suitable material 35. The substrate 30 can be a semi-insulating semiconductor InP wafer, for example. The circuitry layer 25 contains multiple ICs.

Figure 6B:
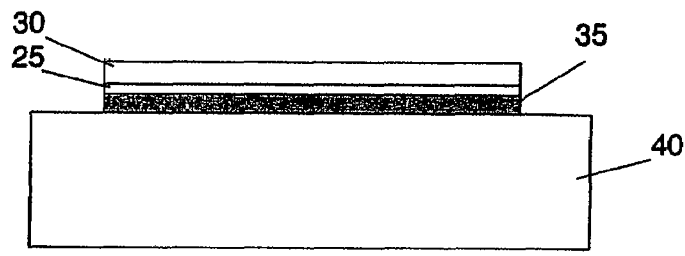

In FIG. 6*b*, a thinning process is performed on the substrate 30. The thinning process can be performed, for example, either by lapping the substrate 30; by etching the substrate 30 (wet or dry); grinding the substrate 30; or a combination of any of these processes can be used to obtain a desired thickness depending on design requirements.

Figure 6C:
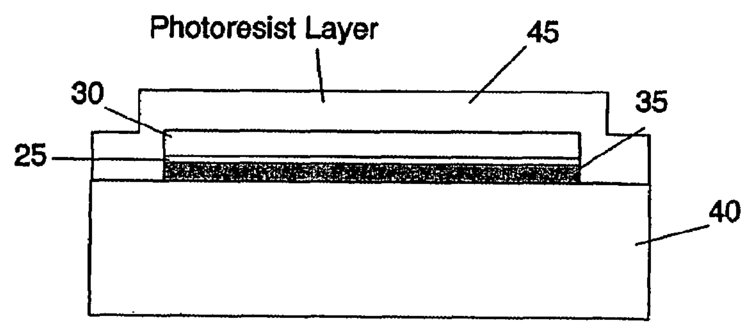
Figure 6D:
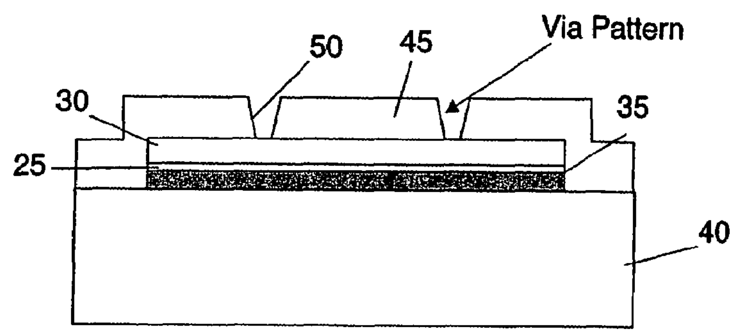
Figure 6E:
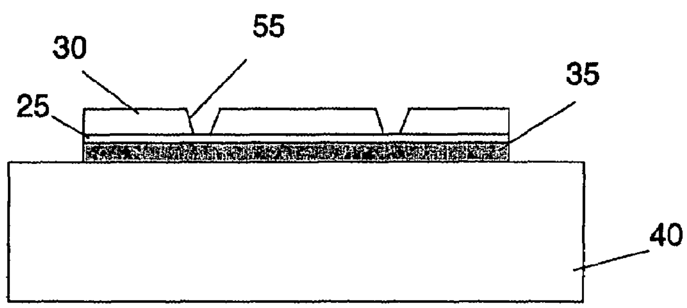
Figure 6F:
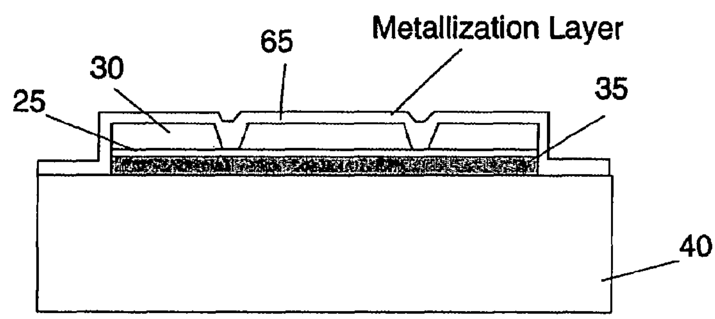
Figure 6G:
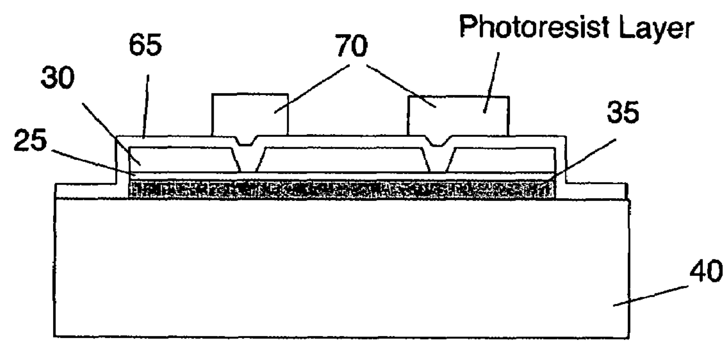
Figure 6H:
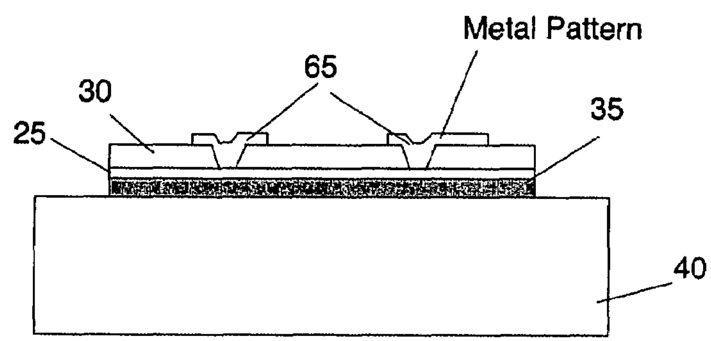

In FIGS. 6*c-h*, a via process is performed on the substrate 30. The via process can be performed by: applying and imaging a via mask 45 to the substrate 30, as shown by FIG. 6*c*; creating a via pattern 50 in the via mask 45, as shown by FIG. 6*d*; etching via holes 55 through the substrate 30 and removing the via mask 45, as shown by FIG. 6*e*; depositing a metallization layer 65 to the backside of the substrate 30 thereby covering via holes 55 with metal, as shown by FIG. 6*f*; applying and imaging a metal mask 70 as shown by FIG. 6*g*; etching the metallization layer 65; and removing the metal mask 70, as shown by FIG. 6*h*.

The via mask 45 and metal mask 70 can be but are not limited to a photoresist material. The metallization layer 65 can consist of but is not limited to first depositing Ti followed by Au metals. The metallization layer 65 can be developed by either evaporating or sputtering metal onto substrate 30 and then plating metal to desired thickness. Etching of the metallization layer 65 can be done through wet etch technique. Wet etching can consist of applying potassium iodide, to etch Au followed by hydrofluoric acid to etch Ti.

Figure 6I:
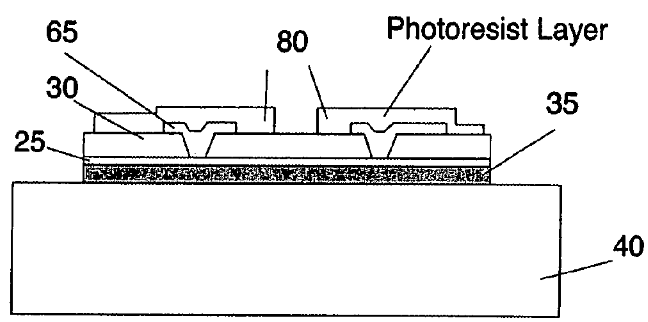
Figure 6J:
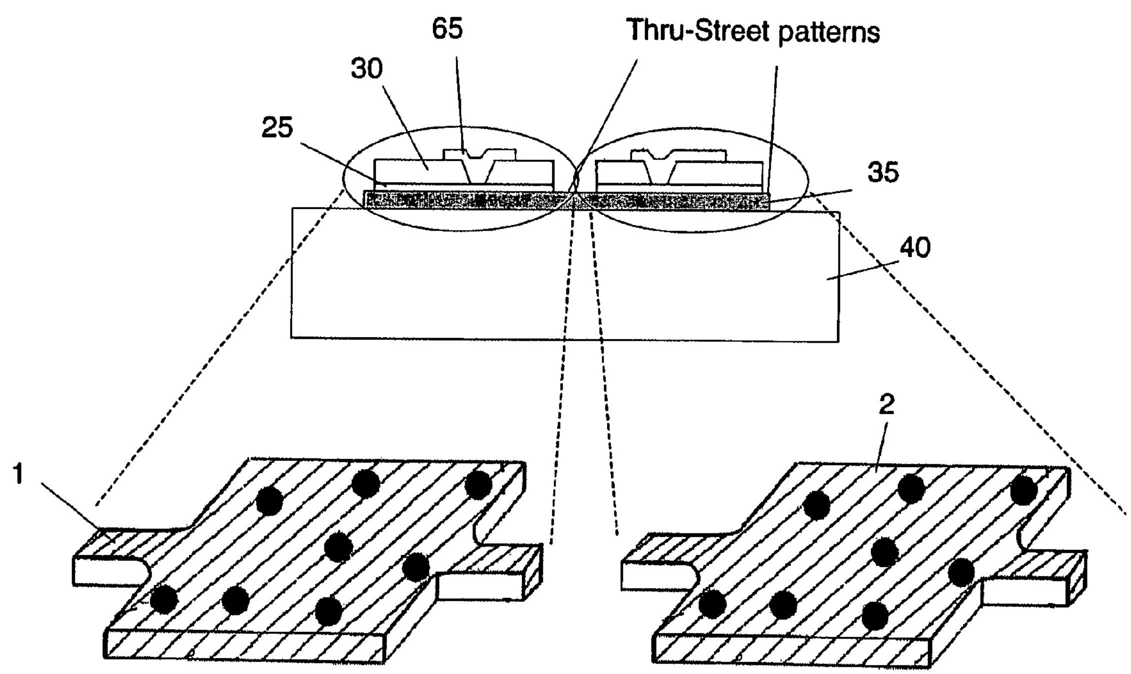

In FIGS. 6*i* and 6*j*, a disjoin process is performed on the substrate 30 and circuitry layer 25. Upon completion of the disjoin process the individual ICs on the wafer will be disjoined from each other. The disjoin process can be performed by: applying and imaging an integrated circuit mask 80 to the substrate 30 exposing only the portions of the substrate 30 that are between the individual ICs, as shown by FIG. 6*i*; etching through the substrate 30 and circuitry layer 25; and removing the integrated circuit mask 80, as shown by FIG. 6*j*.

Alternatively, the process of disjoining the individual ICs from the wafer can be accomplished by a laser die cutting process instead of masking and etching. The laser cutter is guided where the cutting is to be performed. Upon completion of the laser die cutting process, the individual ICs will be disjoined from each other, as shown by FIG. 6*j*.

Finally, removing the wax or other suitable material 35 enables removal of the individual ICs from the support substrate 40, as shown by FIG. 6*j*. The wax 35 can be removed with Tetra-chloro-ethylene (TCE).

In another embodiment, the presently disclosed technology improves the performance and reduces higher order modes of the IC by removing excess semiconductor substrate material 5 around and under the coupling transmission structures 20, as shown by FIG. 7. In this embodiment, the peripheral edge of the semiconductor substrate material 19 closely follows the peripheral edges of the Integrated Circuit 18 and coupling transmission structures 20. The distance between the peripheral edges of the semiconductor substrate material 19 and the peripheral edges of the Integrated Circuit 18 and coupling transmission structures 20 in the FIG. 7 is exaggerated for illustration purposes.

The extra parasitic substrate material can be removed using a backside processing shown and described with reference to FIGS. 8*a-l*. FIGS. 8*a-l* represent the cross section of a wafer, containing multiple ICs, for each of the backside process steps.

Figure 8A:
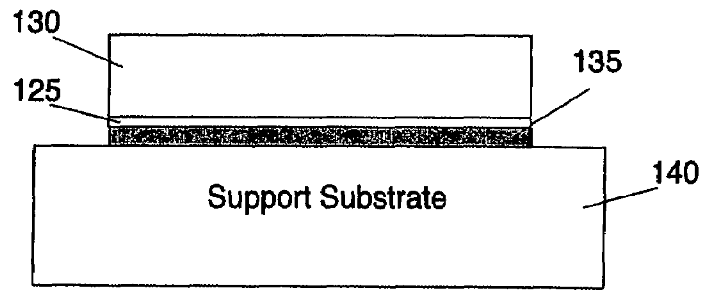

In FIG. 8*a*, a wafer comprises a substrate 130 and a circuitry layer 125. The wafer is mounted with the circuitry layer 125 down on to a support substrate 140 and held in place with a wax or other suitable material 135. The substrate 130 can be a semi-insulating InP wafer. The circuitry layer 125 contains multiple ICs.

Figure 8B:
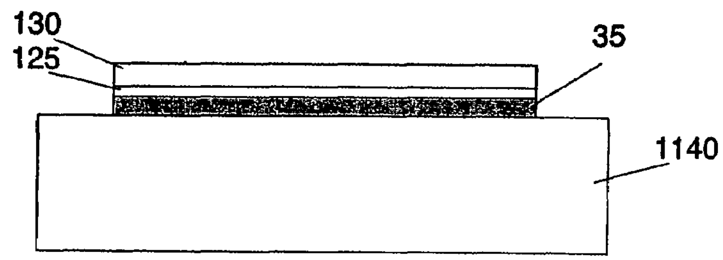

In FIG. 8*b*, a thinning process is performed on the substrate 130. The thinning process can be performed, for example, either by lapping the substrate 130; by etching the substrate 130 (wet or dry); grinding the substrate 130; or a combination of any of these processes can be used to obtain a desired thickness depending on design requirements.

Figure 8C:
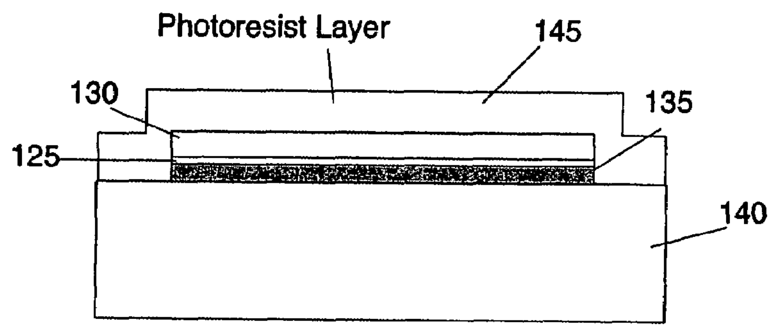
Figure 8D:
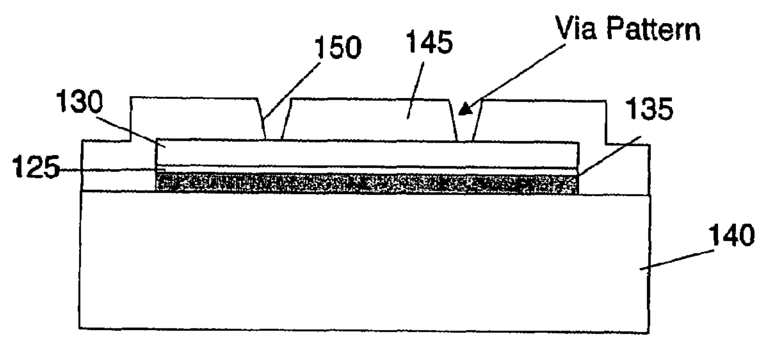
Figure 8E:
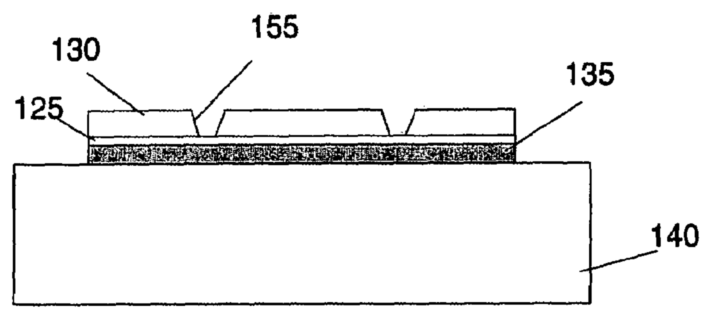
Figure 8F:
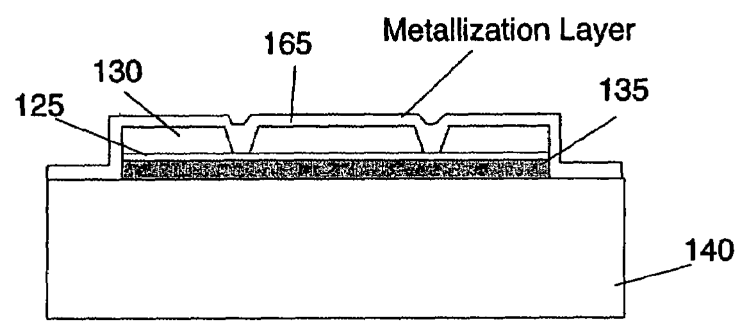
Figure 8G:
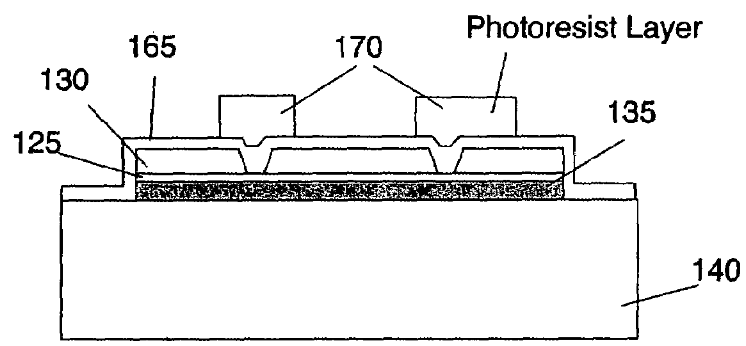
Figure 8H:
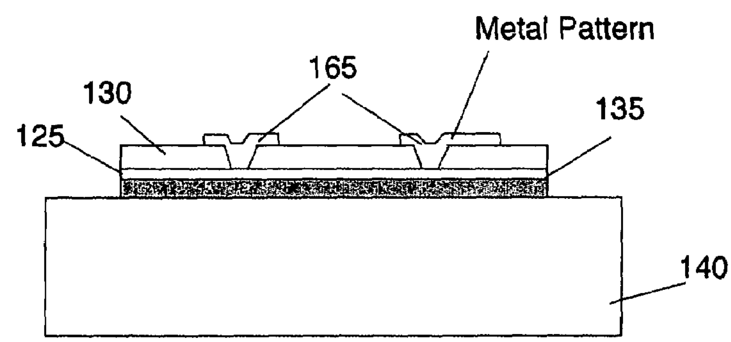

In FIGS. 8*c-h*, a via process is performed on the substrate 130. The via process can be performed by: applying and imaging a via mask 145 to the substrate 130, as shown by FIG. 8*c*; creating a via pattern 150 in the via mask 145, as shown by FIG. 8*d*; etching via holes 155 through the substrate 130 and removing the via mask 145, as shown by FIG. 8*e*; depositing a metallizafion layer 165 to the backside of the substrate 130 thereby covering via holes 155 with metal, as shown by FIG. 8*f*; applying and imaging a metal mask 170 as shown by FIG. 8*g*; etching the metallizafion layer 165; and removing the metal mask 170, as shown by FIG. 8*h*.

The via mask 145 and metal mask 170 can be, but are not limited to, a photoresist material. The metallization layer 165 can consist of but is not limited to first depositing Ti followed by Au metals. The metallization layer 165 can be developed by either evaporating or sputtering metal onto substrate 130 and then plating metal to desired thickness. Etching of the metallization layer 165 can be done through wet etch technique. Wet etching can consist of applying potassium iodide, to etch Au followed by hydrofluoric acid to etch Ti.

Figure 8I:
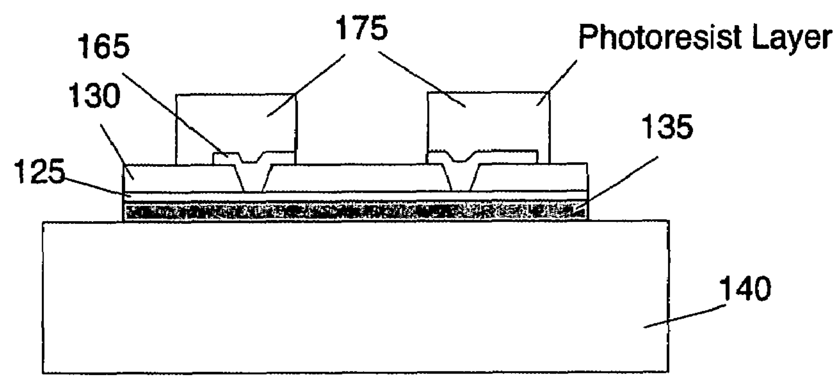
Figure 8J:
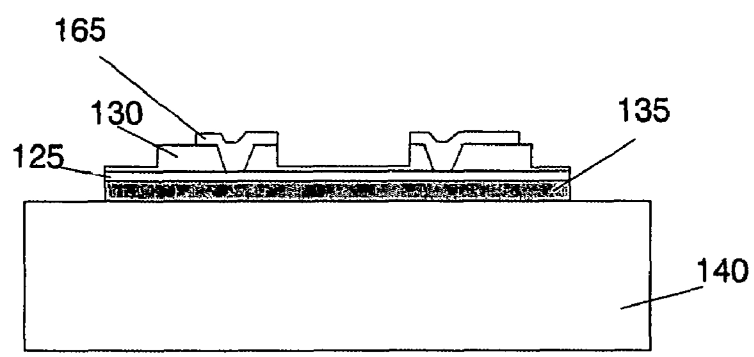

In FIGS. 8*i* and 8*j*, a coupling transmission structure thinning process is performed on the substrate 130. Upon completion of the coupling transmission structure thinning process there is less substrate 130 material covering the coupling transmission structures extending from the individual ICs than there is substrate 130 material covering the circuitry of individual ICs. The coupling transmission structure thinning process can be performed by applying and imaging a coupling transmission structure mask 175 to the substrate 130, which mask exposes only the portions of the substrate 130 that cover the coupling transmission structures extending from the individual ICs, as shown in FIG. 8*i*, followed by etching the substrate 130 to remove a portion of the substrate 130 material covering the coupling transmission structures and removing the coupling transmission Structure mask 175 covering the substrate 130, as shown by FIG. 8*j*.

Alternatively, the coupling transmission structure thinning process can be accomplished with a laser ablation process instead of masking and etching. The laser cutter is guided to where the thinning is to be performed. Upon completion of the laser ablation process a portion of the substrate 130 will be removed, as shown by FIG. 8*j*.

Figure 8K:
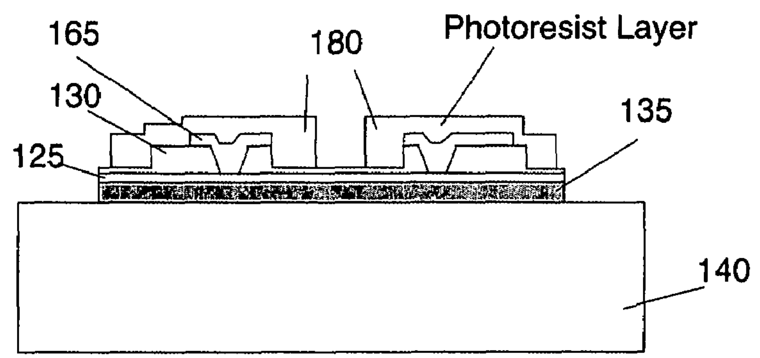
Figure 8I:
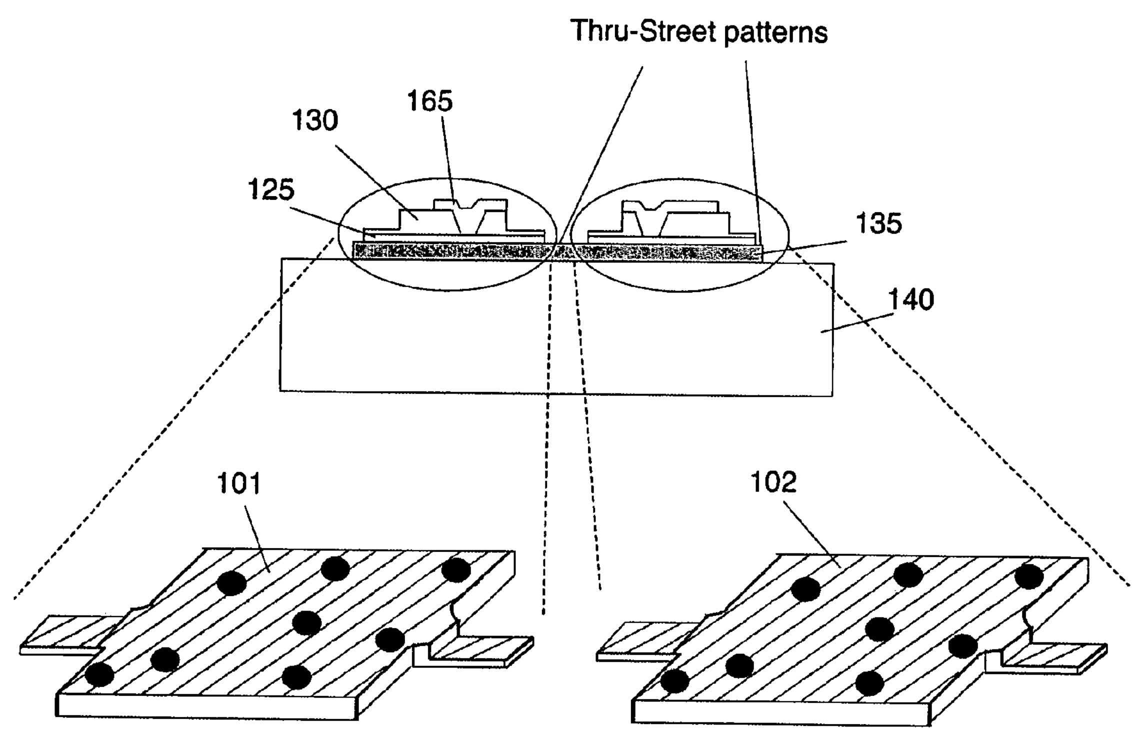

In FIGS. 8*k* and 8*l*, a disjoin process is performed on the substrate 130 and circuitry layer 125. Upon completion of the disjoin process, the individual ICs on the wafer will be disjoined from each other. The disjoin process can be performed by: applying and imaging an integrated circuit mask 180 to the substrate 130 exposing only the portions of the substrate 130 that are between the individual ICs, as shown by FIG. 8*k*; and etching through the substrate 130 and circuitry layer 125 and removing the integrated circuit mask 180, as shown by FIG. 8*l*.

Alternatively, the process of disjoining the individual ICs from the wafer can be accomplished by a laser die cutting process instead of masking and etching. The laser cutter is guided to where the cutting is to be performed. Upon completion of the laser die cutting process the individual ICs will be disjoined from each other, as shown by FIG. 8*l*.

Finally, removing the wax or other suitable material 135 enables removal of the individual ICs from the support substrate 140, as shown by FIG. 8*l*. The wax 135 can be removed with Tetra-chloro-ethylene (TCE).

In another embodiment, the presently disclosed technology improves the performance and reduces higher order modes of the IC by including an etch stop layer 204 under the circuitry layer 201 and removing all the excess semiconductor substrate material 203 that is under the portion of the etch stop layer that is under the coupling transmission structures 202, as shown by FIG. 9. The presently disclosed technology is not limited to the etch stop layer being disposed between the circuitry layer 201 and the substrate material 203. In this embodiment, the peripheral edges of the semiconductor substrate material 203 and etch stop layer 204 closely follow the peripheral edges of the circuitry layer 201 and coupling transmission structures 202. The distances between the peripheral edges of the semiconductor substrate material 203 and etch stop layer 204 and the peripheral edges of the circuitry layer 201 and coupling transmission structures 202 in the FIG. 9 are exaggerated for illustration purposes.

The extra parasitic substrate material can be removed using a backside processing shown in FIGS. 10*a-l*. FIGS. 10*a-l* represent the cross section of a wafer, containing multiple ICs, for each of the backside process steps.

Figure 10A:
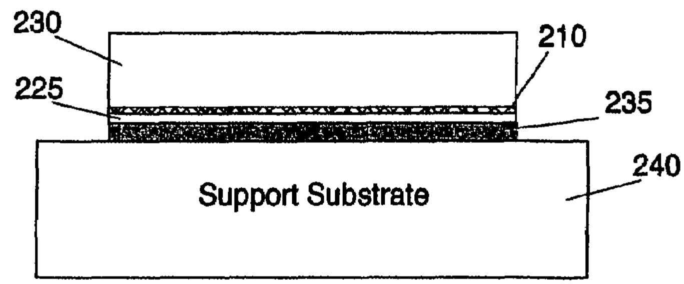

In FIG. 10*a*, a wafer comprises a substrate 230, an etch stop layer 210 and a circuitry layer 225. The wafer is mounted with the circuitry layer 225 down on to a support substrate 240 and held in place with a wax or other suitable material 235. The substrate 230 can be a semi-insulating InP wafer. The circuitry layer 225 contains multiple ICs.

Figure 10B:
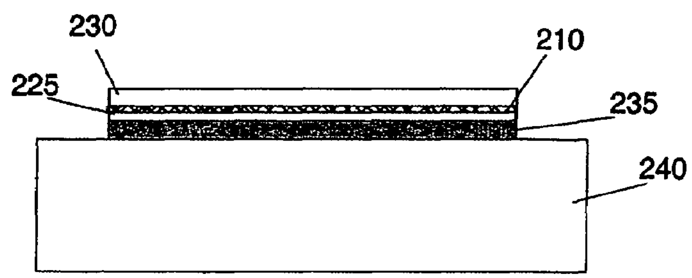

In FIG. 10*b*, a thinning process is performed on the substrate 230. The thinning process can be performed, for example, either by lapping the substrate 230; by etching the substrate 230 (wet or dry); grinding the substrate 230; or a combination of any of these processes can be used to obtain a desired thickness depending on design requirements.

Figure 10C:
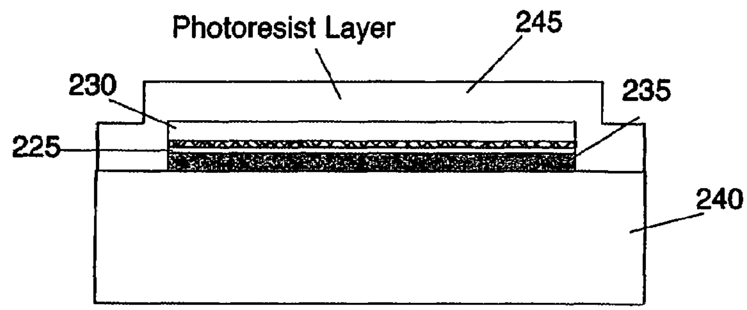
Figure 10D:
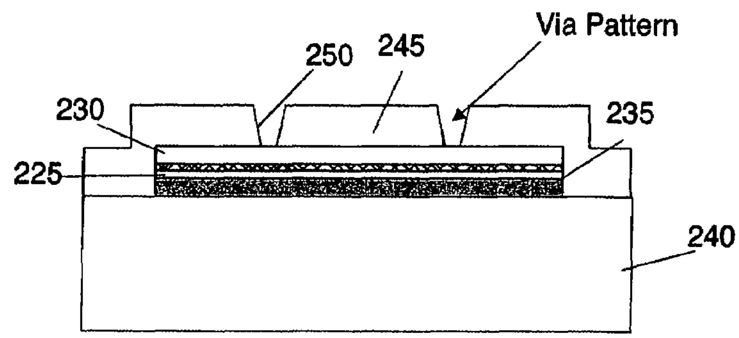
Figure 10E:
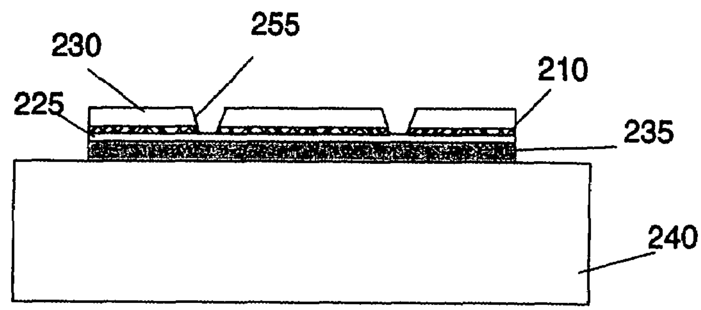
Figure 10F:
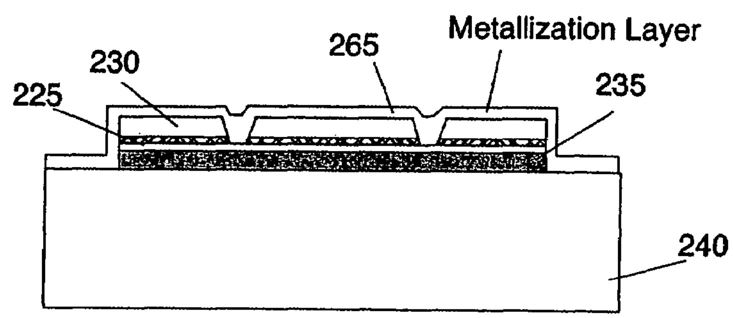
Figure 10G:
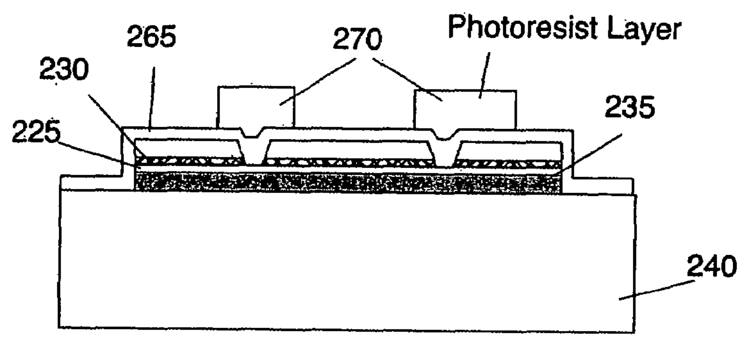
Figure 10H:
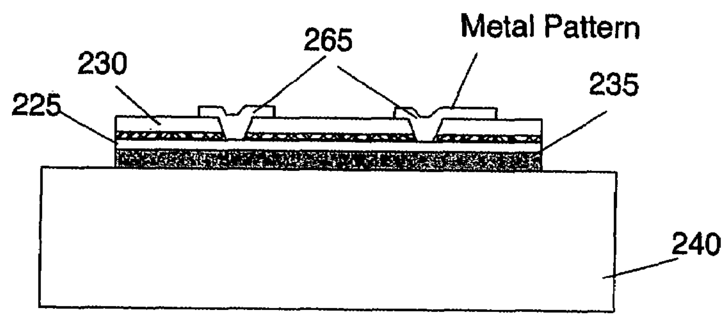

In FIGS. 10*c-h*, a via process is performed on the substrate 230. The via process can be performed by: applying and imaging a via mask 245 to the substrate 230, as shown by FIG. 10*c*; creating a via pattern 250 in the via mask 245, as shown by FIG. 10*d*; etching via holes 255 through the substrate 230 and the etch stop layer 210 and removing the via mask 245, as shown by FIG. 10*e*; depositing a metallization layer 265 to the backside of the substrate 230 thereby covering via holes 255 with metal, as shown by FIG. 10*f*; applying and imaging a metal mask 270 as shown by FIG. 10*g*; etching the metallization layer 265; and removing the metal mask 270, as shown by FIG. 10*h*.

The via mask 245 and metal mask 270 can be, but are not limited to, a photoresist material. The metallization layer 265 can be formed by, but is not limited to, first depositing Ti followed by Au metals. The metallization layer 265 can be developed by either evaporating or sputtering metal onto substrate 230 and then plating metal to a desired thickness. Etching of the metallization layer 265 can be done through wet etch technique. Wet etching can consist of applying potassium iodide to etch Au followed by hydrofluoric acid to etch Ti.

Figure 10I:
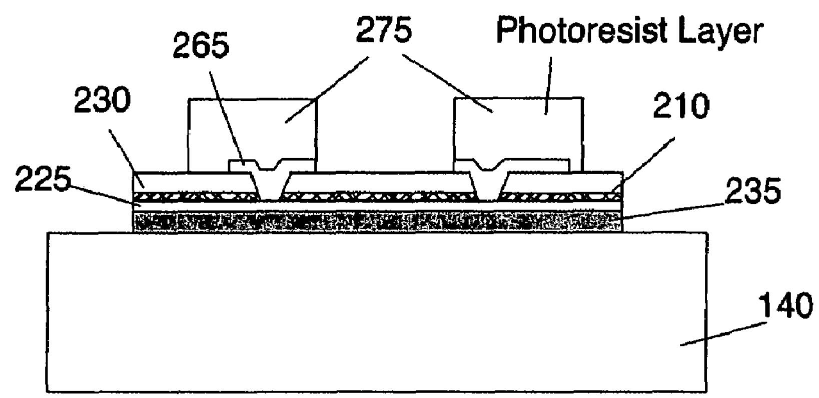
Figure 10J:
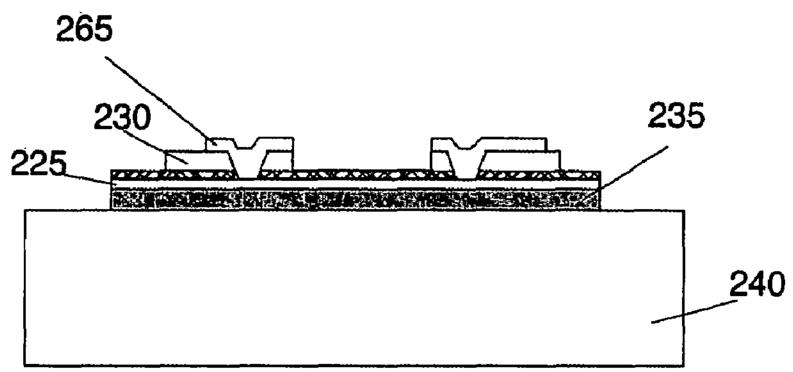

In FIGS. 10*i-j*, a coupling transmission structure thinning process is performed on the substrate 230. Upon completion of the coupling transmission structure thinning process there is less substrate 230 material covering a portion of the etch stop layer 210 that is covering the coupling transmission structures extending from the individual ICs than there is substrate 230 material covering the rest of the etch stop layer 210. The coupling transmission structure thinning process can be performed by applying and imaging a coupling transmission structure mask 275 to the substrate 230 exposing only the portions of the substrate 230 that cover the portion of the etch stop layer 210 that is covering the coupling transmission structures extending from the individual ICs, as shown in FIG. 10*i*, followed by etching the substrate 230 to remove all the substrate 230 material that is covering the portion of the etch stop layer 210 covering the coupling transmission structures and removing the coupling transmission structure mask 275 covering the substrate 230, as shown by FIG. 10*j*.

Figure 10K:
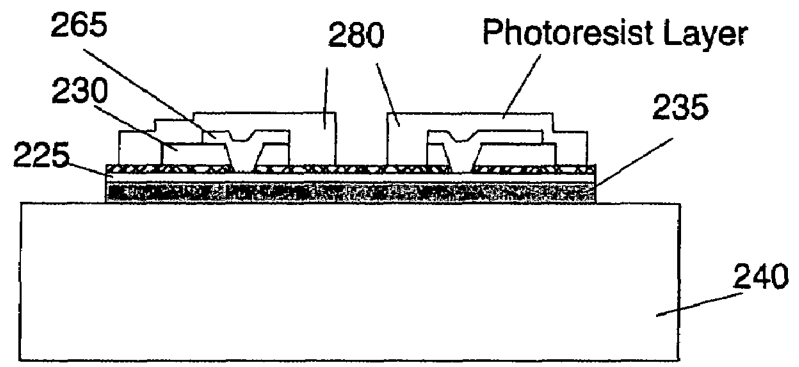
Figure 10I:
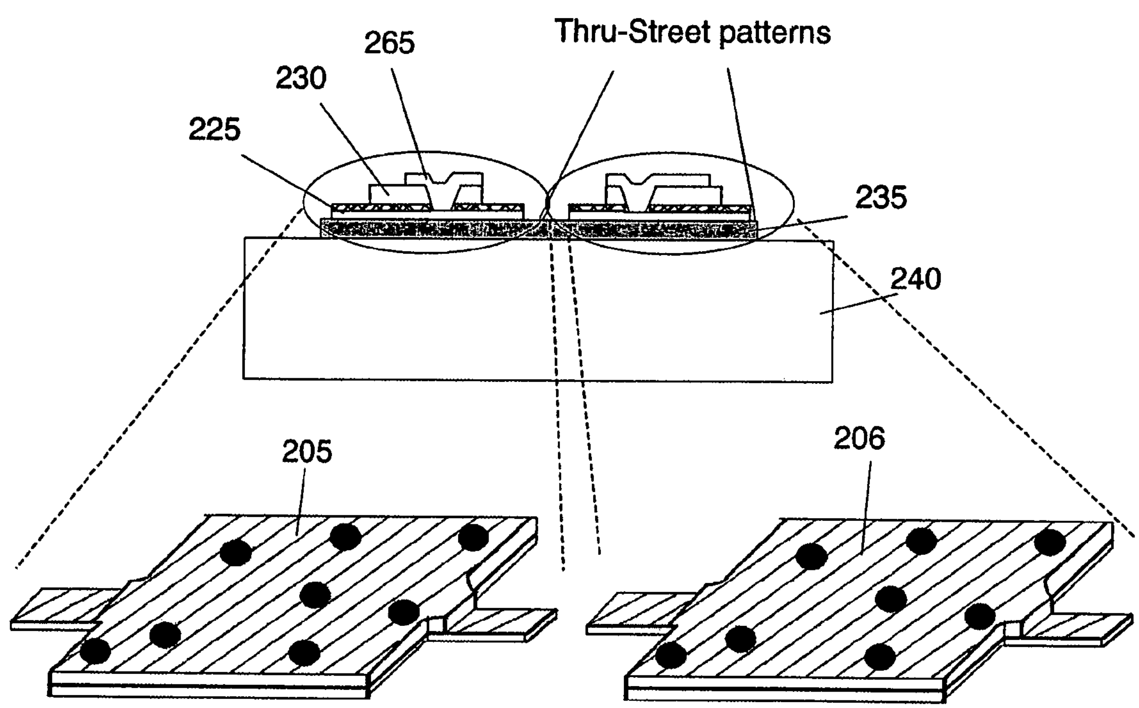

In FIGS. 10*k* and 10*l*, a disjoin process is performed on the substrate 230, the etch stop layer 210 and circuitry layer 225. Upon completion of the disjoin process the individual ICs on the wafer will be disjoined from each other. The disjoin process can be performed by: applying and imaging an integrated circuit mask 280 to the substrate 230 exposing only the portions of the substrate 230 that are between the individual ICs, as shown by FIG. 10*k*; etching through the substrate 230, the etch stop layer 210 and circuitry layer 225; and removing the integrated circuit mask 280, as shown by FIG. 10*l*.

Alternatively, the process of disjoining the individual ICs from the wafer can be accomplished by a laser die cutting process instead of masking and etching. The laser cutter is guided to where the cutting is to be performed. Upon completion of the laser die cutting process the individual ICs will be disjoined from each other, as shown by FIG. **10*l***.

Finally, removing the wax or other suitable material 235 enables removal of the individual ICs from the support substrate 240, as shown by FIG. **10*l*. The wax 235** can be removed with Tetra-chloro-ethylene (TCE).

The embodiments described in detail for exemplary purposes are, of course, subject to many different variations in structure, design and application. Since many varying and different embodiments may be made within the scope of the inventive concepts herein taught, and since many modifications may be made in the embodiment herein detailed in accordance with the descriptive requirements of the law, it is to be understood that the detailed embodiments provided above are to be interpreted as illustrative and not in a limiting sense.

What is claimed is:

1. A method of fabricating a monolithic microwave integrated circuit (MMIC) with one or more coupling transmission structures protruding from the MMIC, the method comprising:

providing a support substrate;

providing a wafer containing a face side, a back side, and a plurality of individual MMICs disposed on the face side;

providing a material for holding the wafer on the support substrate;

applying the material and placing the wafer on to the support substrate so as the face side is disposed on the support substrate and the material is disposed between the face side and the support substrate;

performing a disjoin process wherein the plurality of individual MMICs are disjoined from the wafer with the one or more coupling transmission structures protruding from the plurality of individual MMICs, the one or more coupling transmission structures being supported by at least a portion of the face side of the wafer;

removing the material holding the wafer on the support substrate.

2. The method of claim 1 wherein the material is a wax.

3. The method of claim 1 further comprising performing a thinning process to the back side of the wafer.

4. The method of claim 3 wherein the thinning process is performed until a required wafer thickness is achieved.

5. The method of claim 4 wherein the required wafer thickness ranges from 15 um to 50 um.

6. The method of claim 3 wherein the thinning process is performed by lapping the back side of the wafer.

7. The method of claim 3 wherein the thinning process is performed by etching the back side of the wafer.

8. The method of claim 3 wherein the thinning process is performed by grinding the back side of the wafer.

9. The method of claim 3 wherein the thinning process is performed by lapping, grinding and etching the back side of the wafer.

10. The method of claim 1 further comprising performing a via process to form a plurality of vias in the wafer.

11. The method of claim 10 wherein the via process comprises:

applying and imaging a via mask to the back side;

creating a via pattern in the via mask;

etching the vias;

removing the via mask;

depositing a metal layer to fill via holes created by the etching applying and imaging a metal mask on the back side;

etching the metal layer to remove the excess metal from the back side removing the metal mask.

12. The method of claim 11 wherein the depositing of the metal layer is performed by evaporating the metal layer and plating the metal layer.

13. The method of claim 11 wherein the depositing of the metal layer is performed by sputtering the metal layer and plating the metal layer.

14. The method of claim 11 wherein the metal layer comprises Ti and Au.

15. The method of claim 14 wherein the etching of the metal layer is performed by a wet etch.

16. The method of claim 11 wherein the via mask is a photoresist material.

17. The method of claim 16 wherein the wet etch comprises a potassium iodide and a hydrofluoric acid.

18. The method of claim 11 wherein the metal mask is a photoresist material.

19. The method of claim 1 further comprising performing a coupling transmission structure thinning process to the back side of the wafer.

20. The method of claim 19 wherein performing a coupling transmission structure thinning process comprises:

applying and imaging a coupling transmission structure mask to the back side so as not to mask a portion of the back side covering the one or more coupling transmission structures protruding from the plurality of individual MMICs;

etching the back side;

removing the coupling transmission structure mask.

21. The method of claim 20 wherein the etching of the back side is performed until a desired thickness of the back side over the one or more coupling transmission structures is achieved.

22. The method of claim 19 wherein the wafer further comprises an etch stop layer.

23. The method of claim 22 wherein the etch stop layer is disposed between the plurality of individual MMICs and the back side.

24. The method of claim 22 wherein performing a coupling transmission structure thinning process comprises:

applying and imaging a coupling transmission structure mask to the back side so as not to mask a portion of the back side covering a portion of the etch stop layer that is covering the one or more coupling transmission structures protruding from the plurality of individual MMICs;

etching the back side;

removing the coupling transmission structure mask.

25. The method of claim 24 wherein the etching of the back side is performed until a etch stop layer is not covered by the back side.

26. The method of claim 22 wherein the disjoin process comprises:

guiding a laser cutter over the back side so as to disjoin the individual MMICs from the wafer.

27. The method of claim 22 wherein the disjoin process comprises:

applying and imaging a integrated circuit mask to the back side so as not to cover a portion of the back side that is between the individual MMICs;

etching through the wafer;

removing the via mask.

28. The method of claim 19 wherein performing a coupling transmission structure thinning process comprises:

guiding a laser cutter over the back side covering the one or more coupling transmission structures protruding from the plurality of individual MMICs so as to remove a portion of the back side covering the one or more coupling transmission structures protruding from the plurality of individual MMICs.

29. The method of claim 1 wherein the disjoin process comprises:

applying and imaging an integrated circuit mask to the back side so as not to cover a portion of the back side that is between the individual MMICs;

etching through the wafer;

removing the via mask.

30. The method of claim 1 wherein the removing of the material is performed by applying tetra-chloro-ethylene.

31. The method of claim 1 wherein the disjoin process comprises:

guiding a laser cutter over the back side so as to disjoin the individual MMICs from the wafer.

* * * * *